(12) United States Patent
Sharawi

(10) Patent No.: US 8,730,104 B2
(45) Date of Patent: May 20, 2014

(54) PROGRAMMABLE WIDE-BAND RADIO FREQUENCY FEED NETWORK

(75) Inventor: Mohammad S. Sharawi, Dhahran (SA)

(73) Assignee: King Fahd University of Petroleum and Minerals, Dhahran (SA)

(*) Notice: Subject to any disclaimer, the term of this patent is extended or adjusted under 35 U.S.C. 154(b) by 186 days.

(21) Appl. No.: 13/471,363

(22) Filed: May 14, 2012

(65) Prior Publication Data

US 2013/0300499 A1 Nov. 14, 2013

(51) Int. Cl.
*H01Q 3/38* (2006.01)
(52) U.S. Cl.
USPC .......................................... 342/374; 342/372
(58) Field of Classification Search
CPC ............. H01Q 3/26; H01Q 3/28; H01Q 3/30; H01Q 3/32; H01Q 3/34; H01Q 3/36; H01Q 3/38
USPC .................................................. 342/372, 374
See application file for complete search history.

(56) References Cited

U.S. PATENT DOCUMENTS

| | | | | |
|---|---|---|---|---|
| 5,457,465 | A * | 10/1995 | Collier et al. | ................. 342/374 |
| 6,266,010 | B1 * | 7/2001 | Ammar et al. | ................. 342/374 |
| 6,496,157 | B1 | 12/2002 | Mottier | |
| 6,741,207 | B1 | 5/2004 | Allison et al. | |
| 7,009,560 | B1 | 3/2006 | Lam et al. | |
| 7,408,507 | B1 | 8/2008 | Paek et al. | |
| 7,889,128 | B2 | 2/2011 | Tong | |
| 8,026,863 | B2 | 9/2011 | Young et al. | |
| 8,077,111 | B2 | 12/2011 | Derneryd et al. | |
| 2009/0040107 | A1 | 2/2009 | Yun et al. | |

* cited by examiner

Primary Examiner — Cassie Galt
(74) Attorney, Agent, or Firm — Richard C Litman

(57) ABSTRACT

The programmable wide-band radio frequency feed network is a wideband multi-port microwave/RF feed network that can operate with multiple communication bands covering a wide frequency range. In addition, the feed network is programmable via a digital controller and has two degrees of freedom, viz., amplitude and phase variations. The feed network provides amplification as well as attenuation to the amplitude of the incoming signals. The feed network is designed using discrete microwave components, and fabricated on a multi-layer printed circuit board (PCB) with a small footprint. The digitally controlled feed network is ideal for any antenna array application within the covered frequency range, and can be re-programmed for various wireless communication standards.

8 Claims, 5 Drawing Sheets

PROGRAMMABLE WIDE-BAND RADIO FREQUENCY FEED NETWORK

BACKGROUND OF THE INVENTION

1. Field of the Invention

The present invention relates to control electronics for phased array antenna systems, and particularly to a programmable wide-band radio frequency feed network adapted for a phased array antenna system that uses multiple antenna elements or multiple RF paths to optimize signal transmission and reception.

2. Description of the Related Art

Antenna arrays rely on microwave or radio frequency (RF) feed networks to provide the appropriate excitations for the array to function according to its design specifications. The excitations of the various elements of the antenna array are provided to steer the beam in a certain direction to enhance the communication link (thus beam steering) or create nulls in the radiation pattern of the array to eliminate interference (thus null steering).

There are two degrees of freedom that are usually utilized in the design of microwave feed networks, the amplitude and the phase. The different paths within the feed network are given certain amplitude and phase excitations relative to the center path or one of the edge paths. In most applications, the feed network is fixed and engraved within the hardware of the system or antenna structure, operating at a certain narrow frequency band. Thus, it is optimized to work for that application only and cannot be altered once the design is taped out (fabricated). In other designs, the feed network for that application has one degree of freedom (such as the phase excitations, e.g., those in smart antenna systems with phased arrays, or amplitude excitations). Although the most common design is the one that uses phase changes as the degree of freedom in phased array implementations (because it is convenient to control the phases by either voltage controlled devices or by altering the lengths of the feed lines), amplitude variations are also utilized via the use of variable gain amplifiers.

While there are some designs where the feed network has both phase and amplitude variations, the architectures that appear in the literature are only meant for a specific band of frequencies and cannot be used for others. In addition, most of them cover a limited number of frequency bands. For system level engineers, there is no generic architecture that they can use for rapid prototyping of their antenna array designs, where they do not need to worry about the feed network as an integral part of their antenna array design.

Thus, a programmable wide-band radio frequency feed network solving the aforementioned problems is desired.

SUMMARY OF THE INVENTION

The programmable wide-band radio frequency feed network is a wide-band, multi-port microwave/RF feed network that can operate with multiple communication bands covering a wide frequency range. The feed network is programmable via a digital controller and has two degrees of freedom, viz., amplitude and phase variations. The feed network provides amplification, as well as attenuation, to the amplitude of the incoming signals. The feed network is designed using discrete microwave components, and fabricated on a multi-layer printed circuit board (PCB) with a small footprint. The digitally controlled feed network is ideal for any antenna array application within the covered frequency range and has a programming port from which it can be re-programmed for various wireless communication standards. As used herein, the term wide-band means about 4 GHz.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
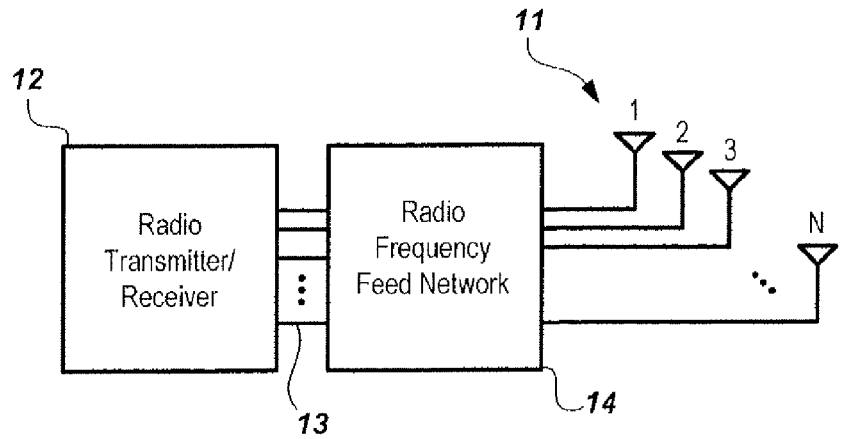
FIG. 1 is a block diagram of a radio transceiver having a phased array antenna that uses a programmable wide-band radio frequency feed network according to the present invention to interface a transceiver (or transmitter or receiver) to the antenna.

The programmable wide-band radio frequency (RF) feed network is operational in a generic phased array antenna communication system, as shown in FIG. 1. Generally, each element of the phased array is configured for a corresponding phase of the RF signal and defines a corresponding RF path in the feed network. In the transmit mode of operation, the radio 12 (which may be a transceiver, a transmitter, or a receiver) sends the RF signals to the RF feed network 14 (or receives the signals from the network) via a single or multiple cable connectors 13. The programmable wide-band radio frequency feed network 14 modifies the amplitudes and phases of the incoming signals for proper application to the antennas 11 for wireless transmission, or modifies the amplitudes and phases of the received signals for proper application to the radio (receiver or transceiver) 11 for reception. The output of the RF feed network 14 can be a single path feeding a single antenna, or multiple paths feeding multiple antennas. This is determined by the application under consideration.

Figure 2:
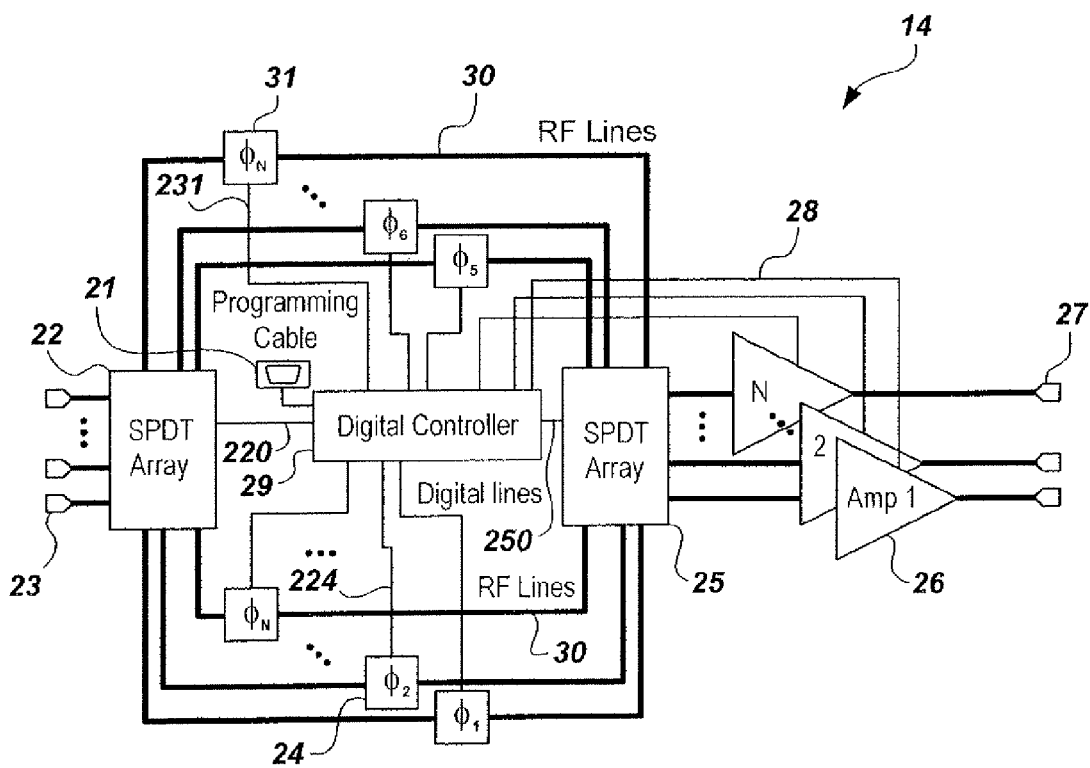
FIG. 2 is a block diagram of an embodiment of a programmable wide-band radio frequency feed network according to the present invention configured for a transmitter.

FIG. 2 shows a more detailed architecture of the digitally controlled, wide-band and programmable RF feed network 14 in the transmit mode (configured for use with a transmitter). The mode of operation that determines the amplitude and phase excitations for the different paths has to be set and programmed into a digitally programmed controller 29 via a programming cable 21. These programmed amplitude and phase excitations are used to control the digitally programmed phase shifters 24, 31 and amplifiers 26 via control lines 224, 231 and 28, respectively. In the transmit mode of operation, the digital controller 29 will be instructed to choose from two frequency ranges of operation, a low range and a high range. For the low range of frequency operation, the digital controller 29 chooses the bottom path of FIG. 2 by sending control signals to the single pole double throw (SPDT) RF switch array 22 via control line 220 to connect the incoming RF signals received at inputs 23 to the low frequency range phase shifters 24 via a set of RF lines 30. The phase shift values for the digitally controlled phase shifters 24 are determined by the digital controller 29 through the type of application stored for the feed network 14. The signal is then passed to another SPDT RF switch array 25 to a bank of programmable amplifiers 26. RF lines 30 are selected by the SPDT switch array 25 under control of digital controller 29, which controls the SPDT switch array 25 via control line 250. Signals carried by the selected RF lines are routed to inputs of selected amplifiers 26 according to the settings of the SPDT switch array 25. The signals undergo amplitude adjustment in the amplifiers 26 under control of the digital controller 29, which also sets the gain of each amplifier 26 via amplitude control lines 28. The RF output is then sent to the output ports 27.

For the high frequency range of operation, the incoming RF signals 23 are passed to the upper branch of FIG. 2 via the SPDT RF switch array 22. It is then passed to the digitally controlled phase shifters 31 through a set of RF cables 30. The outputs of the shifters are passed to the second SPDT RF switch array 25, and then to the bank of digitally controlled amplifiers 26 for amplitude adjustments. The amplifier outputs are then passed to the output RF lines 27. This architecture can work with any number of input/output signals and can have more than two paths if required by the frequency ranges to be covered.

Figure 3:
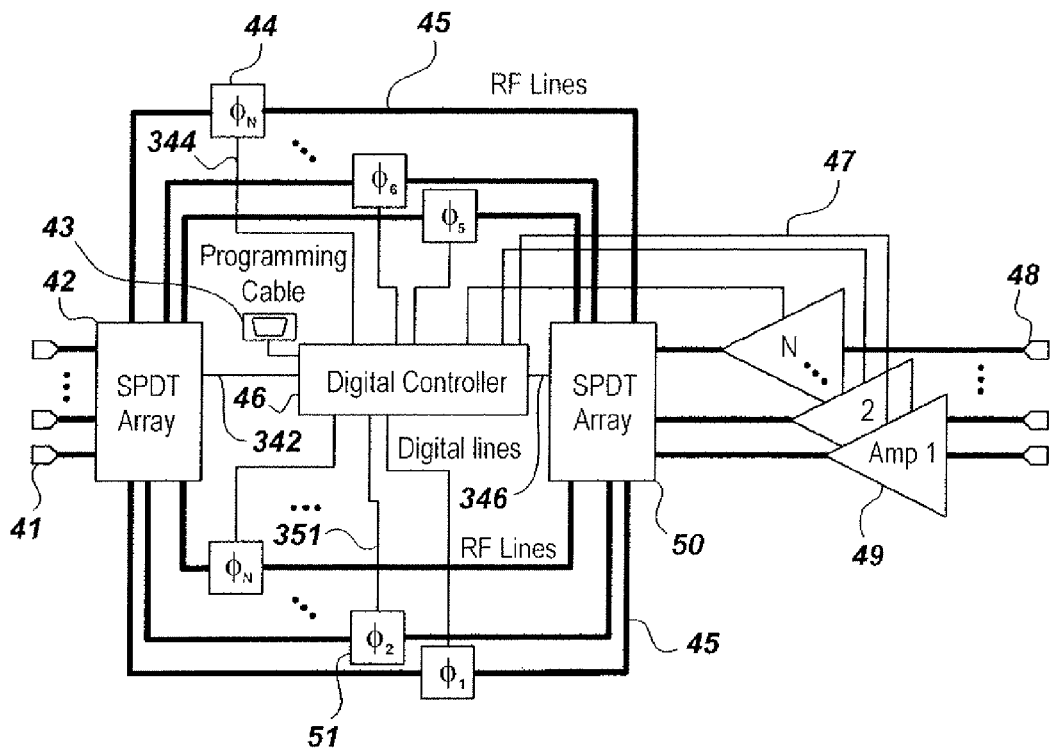
FIG. 3 is a block diagram of an embodiment of a programmable wide-band radio frequency feed network according to the present invention configured for a receiver.

FIG. 3 shows the architecture for the receive mode of operation. The program that defines the amplitude and phase levels for the application considered is transferred and stored into the digital controller 46 via the programming cable 43. RF signals coming from multiple antennas are passed to the inputs 48 of the digitally controlled feed network. The signals are then passed to the amplifier bank 49. Control signals are sent via control lines 47 from the digital controller 46 to the amplifiers to set gains of amplifier bank 49 to the appropriate levels. After having their levels adjusted, the RF signals are passed to the SPDT switch array 50 to be sorted or routed to the correct phase path as determined by the digital controller 46, which controls the SPDT array 50 via control line 346. The RF signals are passed to the low band digitally controlled phase shifters 51 and the high band digitally controlled phase shifters 44 via the RF lines 45. The digital controller 46 adjusts the low band phase shifters 51 via low band control lines 351 and adjusts the high band phase shifters 44 via high band control lines 344. The system also may accommodate any number of paths. Thus, more than two paths can be provided, if the switch arrays 42 and 50 are adjusted accordingly. The controller 46 also controls the SPDT switch array 42 via control line 342. After phase adjustments, the signals are passed to the output SPDT switch array 42, and then to the feed network output ports 41, which are connected to the radio receiver 12.

Figure 4:
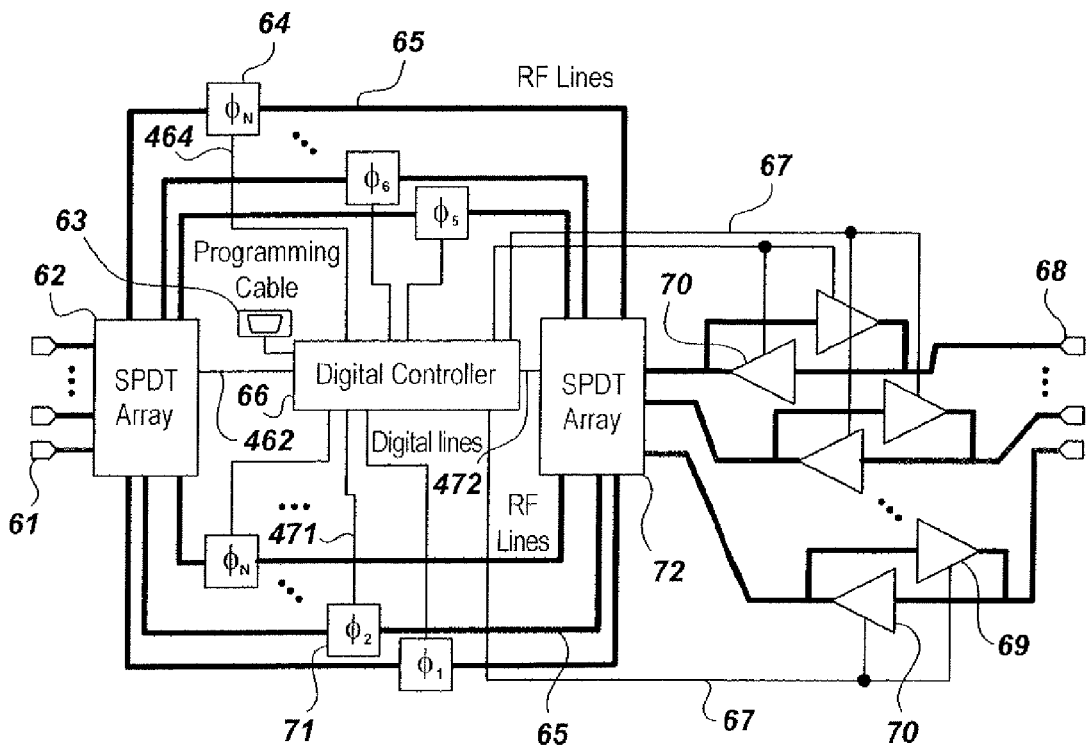
FIG. 4 is a block diagram of an alternative embodiment of a programmable wide-band radio frequency feed network according to the present invention configured for a transceiver, or for both a transmitter and a receiver.

Another configuration that will provide a digitally controlled and wide-band feed network in transceiver architecture (or a discrete transmitter and a discrete transmitter, the feed network having transmitter and receiver modes in one design) is shown in FIG. 4. The program that determines the mode of operation is loaded on the digital controller 66 via the programming cable 63. The feed network can now be used alternately in receive mode or in transmit mode. The amplifier bank, including the transmit amplifiers 69 and the receive amplifiers 70, is switched according to the desired mode via the amplifier control cables 67 coming from the digital controller 66. The RF signals received by the antennas come into the network at ports 68 will be passed to the receiver amplifier bank 70 and then to the SPDT switch array 72. The SPDT switch array 72 is set by digital controller 66 via control line 472 to the proper RF path over RF lines 65 either to the low frequency phase shifters 71 or to the high frequency phase shifters 64. The controller 29 adjusts the RF signal phases via control lines 464 (to the high frequency phase shifters 64) and 471 (to the low frequency phase shifters). After phase shifting, the RF signals are then passed to the second SPDT switch array 62 to the selected ports 61 leading to the radio 12. If the transmit mode is chosen, the input signal from ports 61 goes through the appropriate path according to the frequency band of interest, and then gets out of the feed network after having their levels adjusted by the transmit amplifier bank 69. The SPDT switch array 62 is controlled by the digital controller 66 via control line 462.

Figure 5:
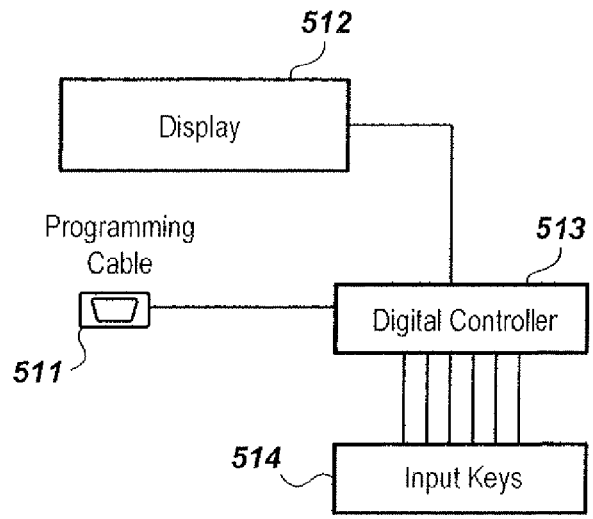
FIG. 5 is a block diagram of the user interface portions of a programmable wide-band radio frequency feed network according to the present invention.

The digital controller interface can have the configuration shown in the diagram of FIG. 5. The program to be loaded is sent to the digital controller 513 via the programming cable 511. The program can prompt the user to choose from different options via the input keys 514, and displays the modes and results on the display 512. This also covers any alternative of this architecture that includes a digital controller, input keys, display and programming cable.

Figure 6:
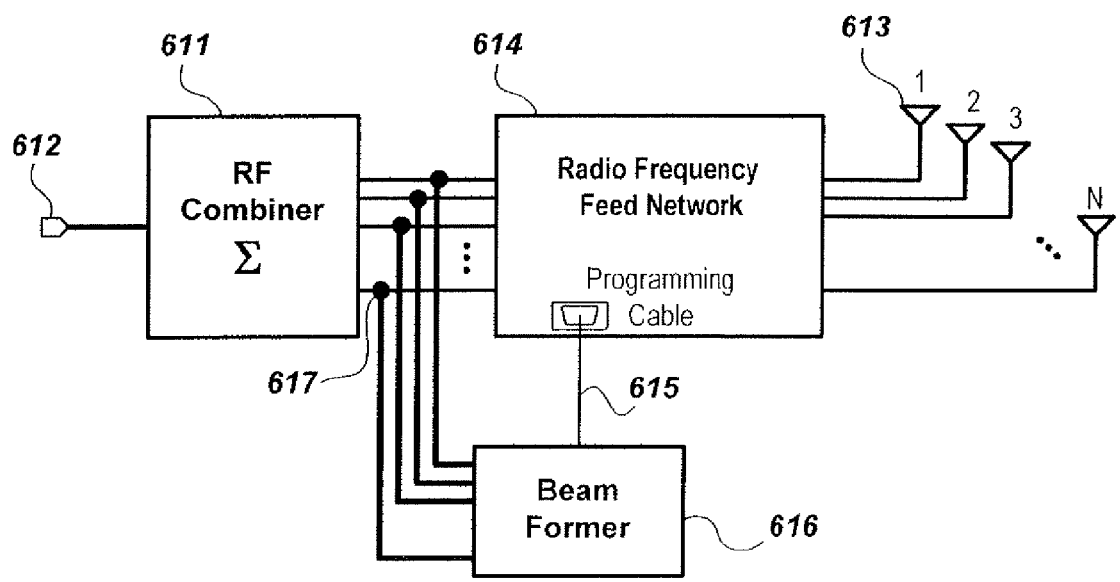
FIG. 6 is a block diagram of a programmable wide-band radio frequency feed network according to the present invention configured with an RF combiner and a beamformer.

The programmable wide-band radio frequency feed network can be used in different configurations, such as the beamforming antenna array architecture shown in FIG. 6. A conventional beamformer 616 programmed to execute any conventional beam forming algorithm is used to update the amplitudes and phases of the digitally programmed feed network 614 via a programming cable 615. The beamforming algorithm gets its inputs dynamically from the output of the feed network via cables 617 and feeds back adjustments in the phases and amplitudes for a dynamic mode of operation that is in real time. The incoming signals from the antenna array 613 are passed through the RF feed network 614, where the amplitudes and phases are adjusted and then passed to an RF combiner circuit 611 that provides a single RF output 612 to the radio receiver.

Figure 7A:
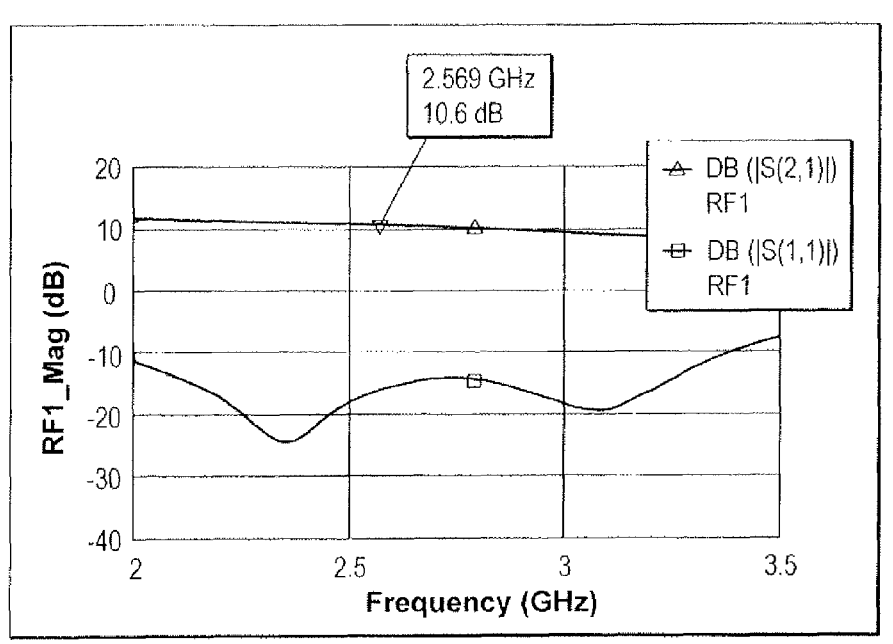
FIG. 7A is a plot showing the RF gain level as a function of frequency for a model of the programmable wide-band radio frequency feed network configuration of FIG. 3 from 2.0-3.5 GHz.
Figure 7B:
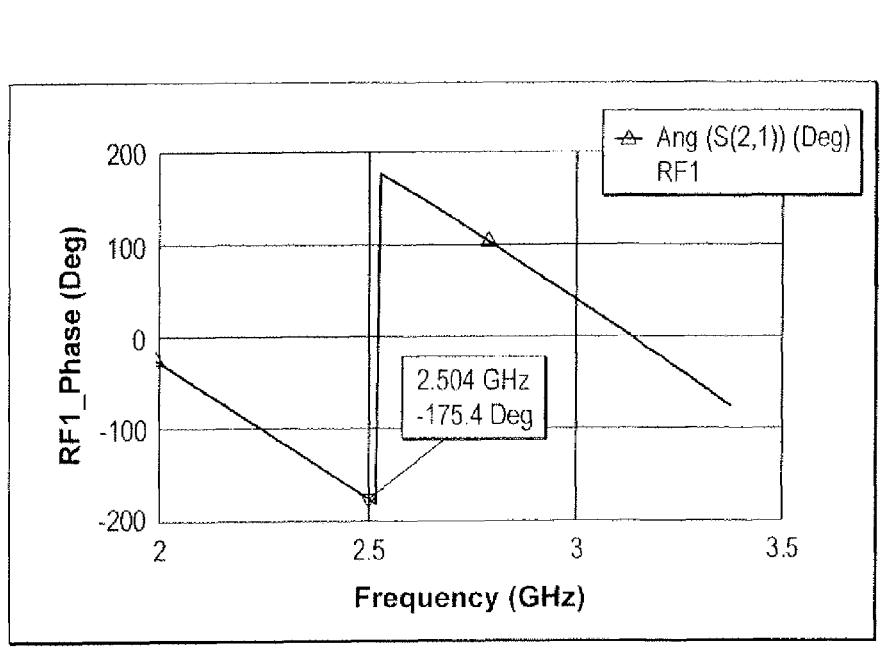
FIG. 7B is a plot showing the phase as a function of frequency for a model of the programmable wide-band radio frequency feed network configuration of FIG. 3 from 2.0-3.5 GHz.

FIGS. 7A-7B show results of a model based on the configuration in FIG. 3. Plot 700 of FIG. 7A shows gain level obtained in the lower frequency branch covering 2.0-3.5 GHz. The results are based on measured s-parameter values of individual components within the feed network path. The phase shift set on the programmable phase shifters 51 was 95.625 degrees and the gain of amplifier 49 was set to its maximum level of 18 dB. The phase shift plot 710 obtained across this low band of operation is shown in FIG. 7B.

Figure 8A:
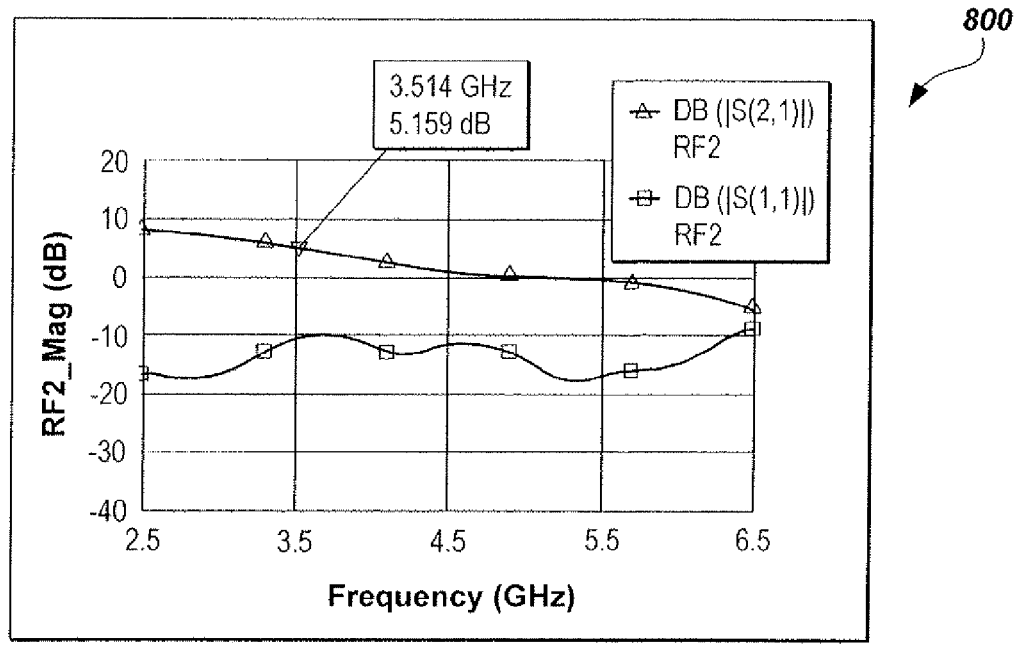
FIG. 8A is a plot showing the RF gain level as a function of frequency for a model of the programmable wide-band radio frequency feed network configuration of FIG. 3 from 2.5-6.5 GHz.
Figure 8B:
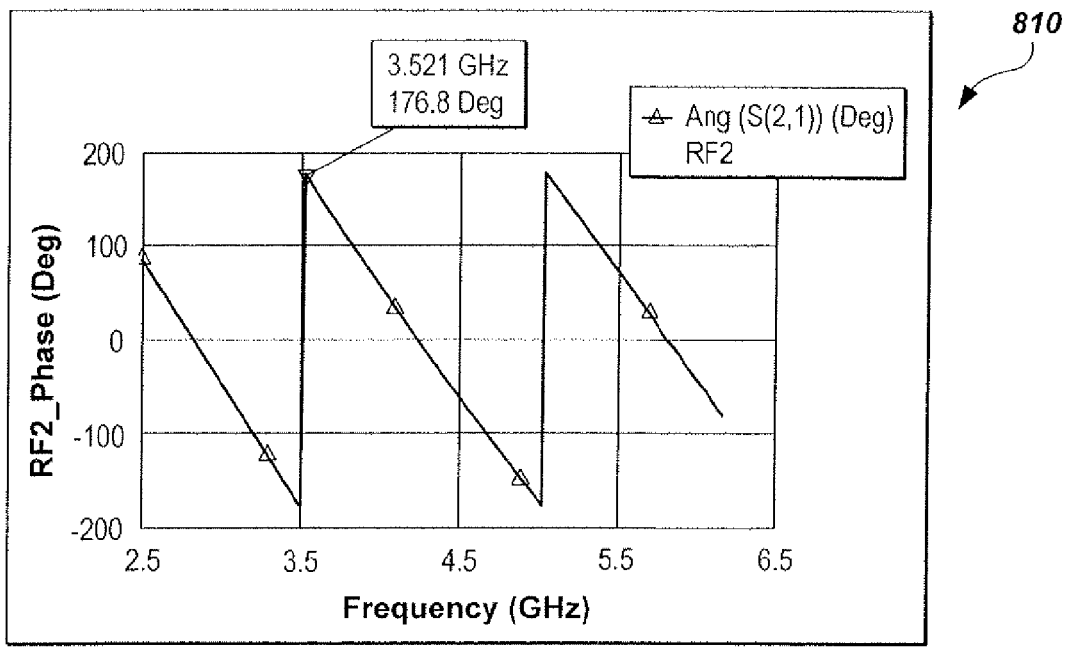
FIG. 8B is a plot showing the phase as a function of frequency for a model of the programmable wide-band radio frequency feed network configuration of FIG. 3 from 2.5-6.5 GHz.

FIGS. 8A-8B show results of a model based on the configuration in FIG. 3. FIG. 8A shows a plot 800 of gain level obtained in the higher frequency branch covering 2.5-6.5

GHz. The results are based on measured s-parameter values of individual components within the feed network path. The phase shift set on the programmable phase shifters 44 was 95.625 degrees and the gain of amplifier 49 was set to its maximum level of 18 dB. The phase shift plot 810 obtained across this high band of operation is shown in FIG. 8B.

The programmable wide-band radio frequency feed network may have different variations and combinations, and may have any number of paths based on the number of frequency bands to be covered, as well as any number of RF input/output ports. The architecture is programmable, and can be customized according to the application to be considered.

It is to be understood that the present invention is not limited to the embodiments described above, but encompasses any and all embodiments within the scope of the following claims.

I claim:

1. A programmable wide-band radio frequency feed network for a phased array antenna system, comprising:
   a plurality of amplifiers adapted for connection to different RF paths of the phased array antenna system;
   a first digitally controlled single-pole double throw (SPDT) switching array having a plurality of switches, each of the switches having a single pole terminal and two throw terminals, the amplifiers being grouped in pairs, each of the amplifier pairs being connected to a corresponding one of the pole terminals of the first digitally controlled SPDT switching array;
   a first plurality of phase shifters and a second plurality of phase shifters, the first plurality of phase shifters and the second plurality of phase shifters being configured for operation in different frequency ranges, each of the switches in the first SPDT array having the phase shifter from the first plurality and the phase shifter in the second plurality connected to the two throws of the switch having the amplifier for the corresponding RF path connected to the pole terminal of the switch;
   a second digitally controlled SPDT switching array, having a plurality of switches, each of the switches having a single pole terminal and two throw terminals, each of the switches in the second array having the two throw terminals connected to the phase shifters in the first and second pluralities of phase shifters having the same RF path, each of the switches in the second array having the pole terminal for the corresponding RF path adapted for connection to a radio component of the phased array antenna system;
   a digital controller connected to each of the phase shifters, the first digitally controlled SPDT switching array, each of the amplifiers, and the second digitally controlled SPDT switching array, the controller being programmable to adjust the shift applied by each of the phase shifters, to adjust the gain of each of the amplifiers, and to switch between the two throws of each of the switches in the first and second SPDT switch arrays, whereby amplitude and phase adjustments are simultaneously switchable between the different frequency ranges for all RF paths of an RF signal passing through the phased array antenna system; and
   a programming cable connected to the digital controller for programming the digital controller.

2. The programmable wide-band radio frequency feed network according to claim 1, wherein each of the amplifier pairs has a first amplifier having its input connected to a respective first antenna element of said plurality of antenna elements and a second amplifier having its output connected to the respective first antenna element of said plurality of antenna elements, the second amplifier having its input connected to the pole terminal of a selected one of the switches in said first digitally controlled SPDT switching array, the first amplifier having its output connected to the pole terminal of the selected one of the switches in said first digitally controlled SPDT switching array.

3. The programmable wide-band radio frequency feed network according to claim 1, wherein the radio component comprises a radio transmitter, the feed network being configured for RF signals passing from the radio component to the phased antenna array.

4. The programmable wide-band radio frequency feed network according to claim 1, wherein the radio component comprises a radio receiver, the feed network being configured for RF signals passing from the phased antenna array to the radio component.

5. The programmable wide-band radio frequency feed network according to claim 1, wherein said first plurality of phase shifters is configured for a frequency range of high frequency and said second plurality of phase shifters is configured for a frequency range of low frequency.

6. The programmable wide-band radio frequency feed network according to claim 1, wherein the radio component comprises a radio transceiver, the feed network being configured both for or RF signals passing from the radio component to the phased antenna array and for RF signals passing from the phased antenna array to the radio component.

7. The programmable wide-band radio frequency feed network according to claim 1, further comprising:
   an RF combiner disposed between said second digitally controlled SPDT switching array and the radio component of the phased array antenna system, the RF combiner being adapted for combining the RF paths into a single RF signal adapted for output to the radio component; and
   a beamformer connected to said digital controller, said beamformer dynamically adjusting phases and amplitudes of the RF paths connected to the RF combiner.

8. The programmable wide-band radio frequency feed network according to claim 1, further comprising a user interface connected to said digital controller for programming the phase adjustments, the amplitude adjustments, and the frequency range, the user interface including:
   input keys connected to said digital controller; and
   a display connected to said digital controller.

* * * * *